United States Patent
Li et al.

(10) Patent No.: US 7,439,193 B2
(45) Date of Patent: Oct. 21, 2008

(54) PATTERNING METHOD FOR FABRICATING HIGH RESOLUTION STRUCTURES

(75) Inventors: Shunpu Li, Cambridge (GB); Christopher Newsome, Cambridge (GB); David Russell, Cambridge (GB); Thomas Kugler, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/320,582

(22) Filed: Dec. 30, 2005

(65) Prior Publication Data
US 2006/0194444 A1   Aug. 31, 2006

(30) Foreign Application Priority Data
Feb. 25, 2005   (GB) ................ 0503926.8

(51) Int. Cl.
*H01L 21/00* (2006.01)
(52) U.S. Cl. .................... 438/780; 438/161
(58) Field of Classification Search ............ 438/750, 438/780, 161
See application file for complete search history.

(56) References Cited

U.S. PATENT DOCUMENTS

| 4,359,816 | A |   | 11/1982 | Abbas et al. |
| 4,784,718 | A | * | 11/1988 | Mitani et al. ............. 438/183 |
| 5,147,740 | A | * | 9/1992  | Robinson ................. 430/5 |
| 6,183,938 | B1 | * | 2/2001 | Lyons et al. ............. 430/313 |
| 6,383,952 | B1 | * | 5/2002 | Subramanian et al. ..... 438/781 |
| 6,566,280 | B1 | * | 5/2003 | Meagley et al. ........... 438/780 |
| 2002/0155389 | A1 | * | 10/2002 | Rangarajan et al. ..... 430/314 |
| 2004/0029382 | A1 | * | 2/2004 | Kawase ................. 438/689 |
| 2004/0201011 | A1 | * | 10/2004 | Sakurada et al. ......... 257/40 |

FOREIGN PATENT DOCUMENTS

| JP | A 58-145133 | 8/1983 |
| JP | A 60-066432 | 4/1985 |
| JP | A 06-188288 | 7/1994 |
| WO | WO 2004/013922 A2 | 2/2004 |

\* cited by examiner

*Primary Examiner*—Charles D. Garber
*Assistant Examiner*—Reema Patel
(74) *Attorney, Agent, or Firm*—Oliff & Berridge, PLC

(57) ABSTRACT

Provided is a patterning method capable of fabricating high resolution structures without using a high resolution patterning step. The method comprises the steps of: (i) pre-patterning a layer of material (12) on a substrate (10), (ii) spin-coating a solution of a film-forming substance over the pre-patterned substrate, (iii) drying the spin-coated solution to form a film (14) of the film-forming substance on the unpatterned areas of the substrate and on the surface and sides of the pre-patterned material, (iv) etching the dried film in such a way that it remains only around the sides of the pre-patterned material, and (v) removing the pre-patterned material to leave ridges (20) of the film-forming substance on the substrate, the pattern of the ridges corresponding to the outline of the pre-patterned material.

A metal layer may then be deposited on the resulting patterned substrate followed by removal of the ridges leaving discrete areas of metal which form latent source and drain electrodes of a thin film transistor. An array of thin film transistors may then be formed by selectively depositing areas of semiconductor, insulator and conductor, the latter forming a gate electrode associated with each pair of source and drain electrodes.

12 Claims, 6 Drawing Sheets

Evaporating metal on the ridged substrate

Figure 1a – Substrate and layer of patternable material
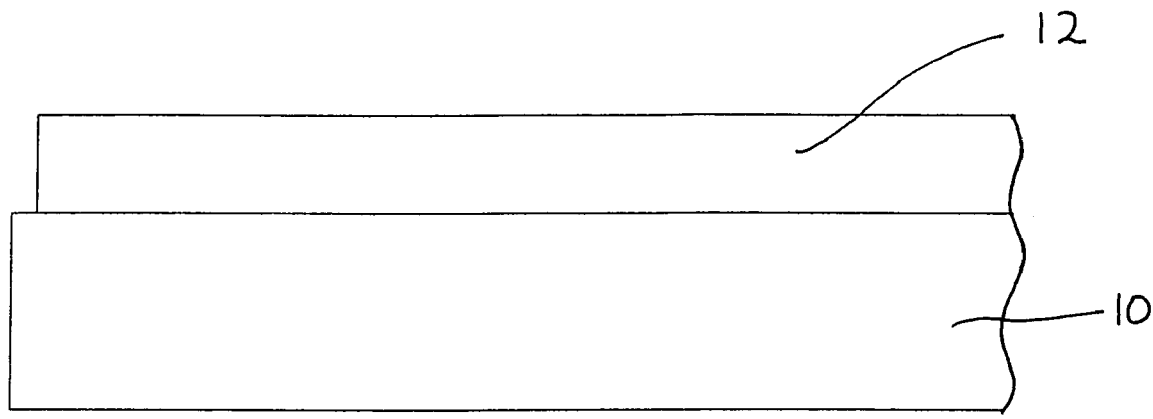
Figure 1b – Masking the patternable material
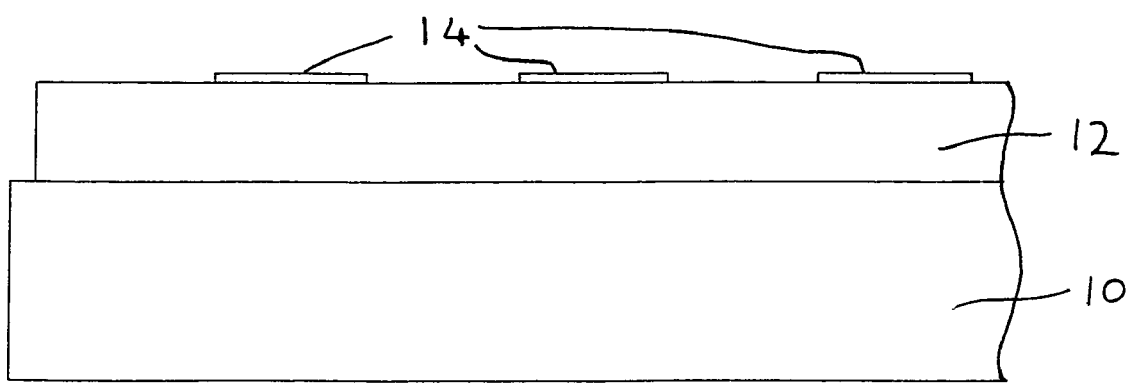

Figure 1c – Etching the masked patternable material
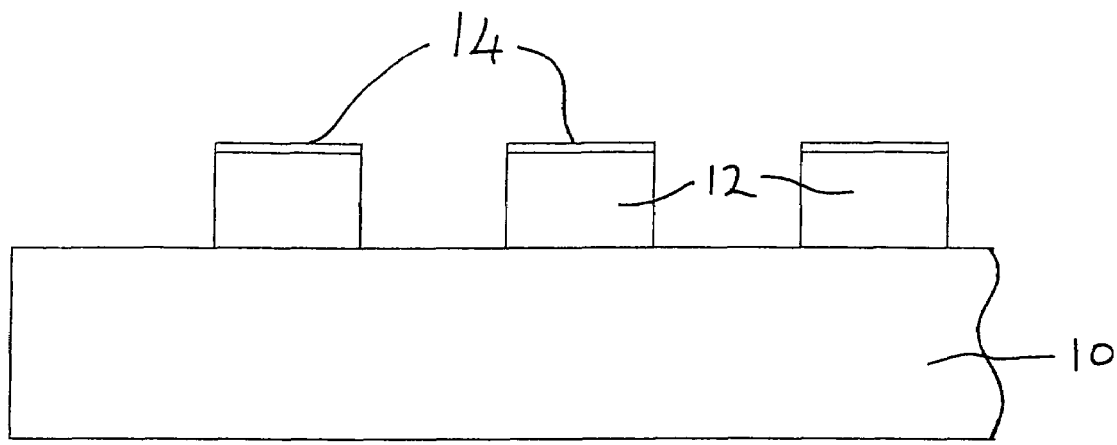
Figure 1d – Spin-coating the solution of the film-forming substance
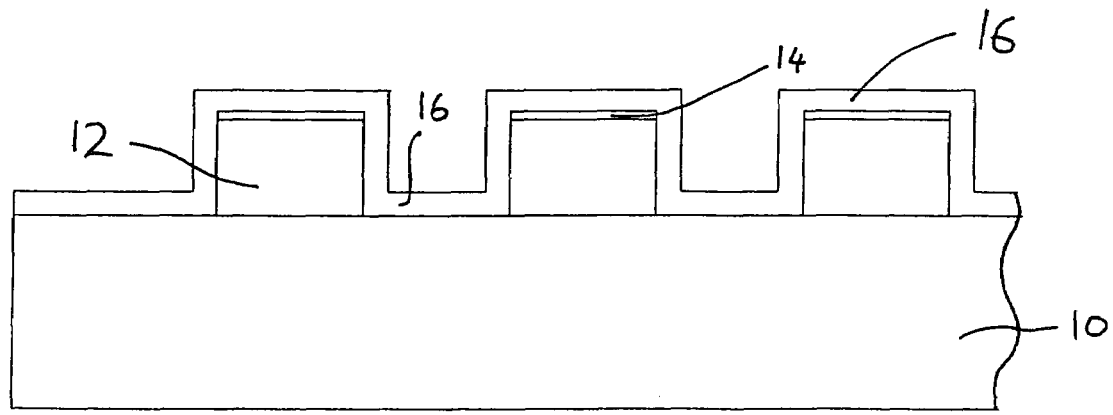

Figure 1e – Etching the spin-coated film
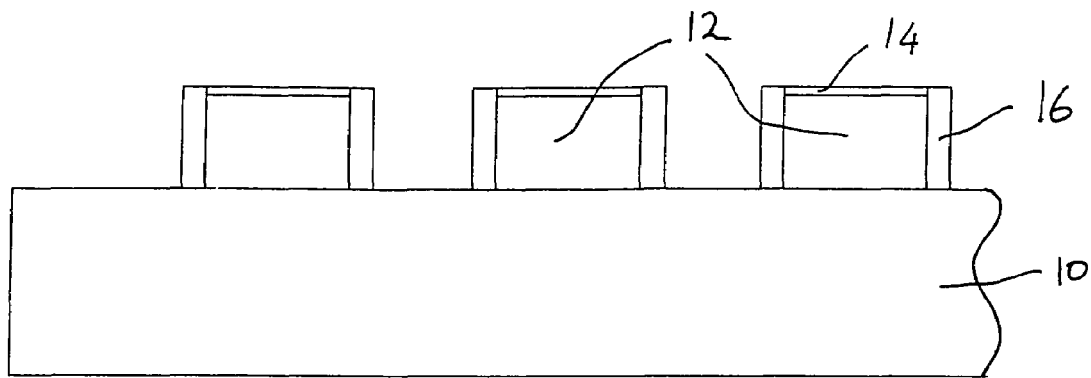
Figure 1f – Removing the patterned material
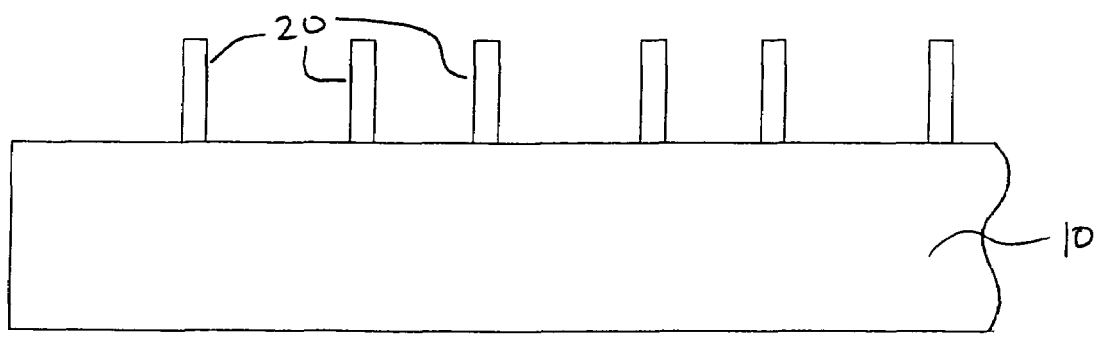

Figure 2a – Etched masked patternable material having sloping sides
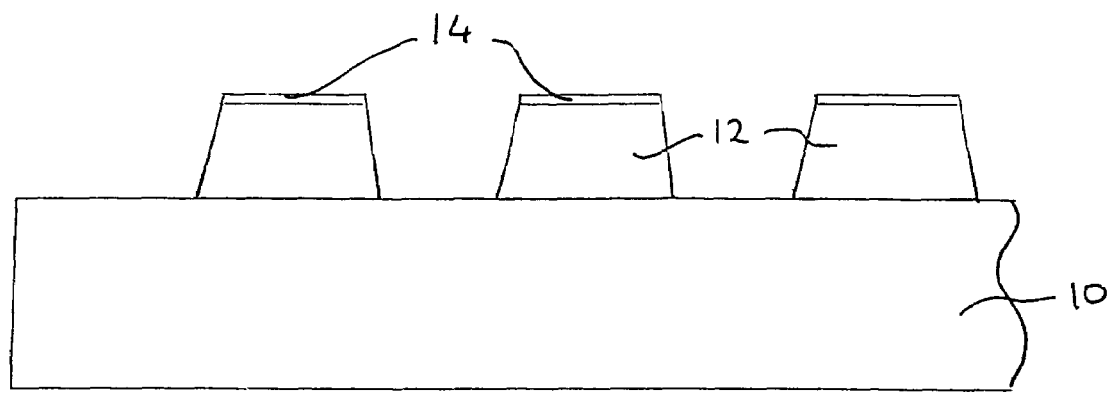
Figure 2b – Inclined ridges formed from the film-forming substance
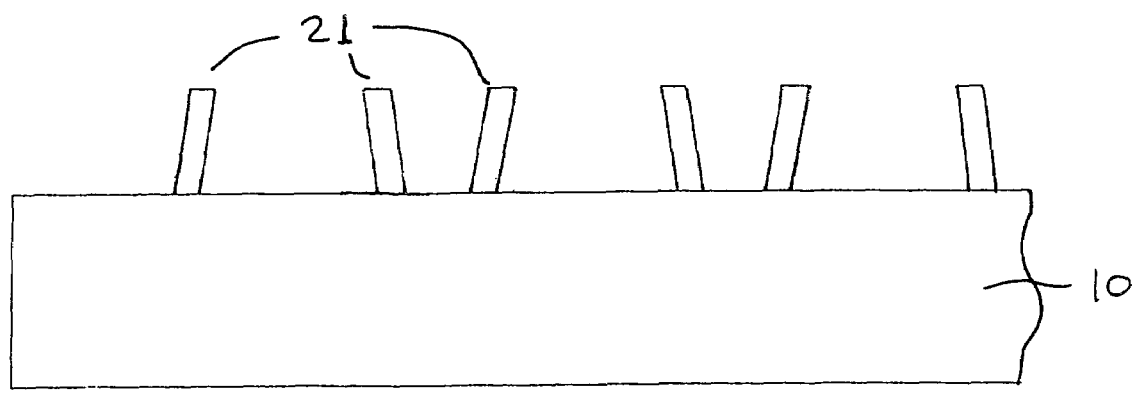

Figure 3a – Evaporating metal on the ridged substrate
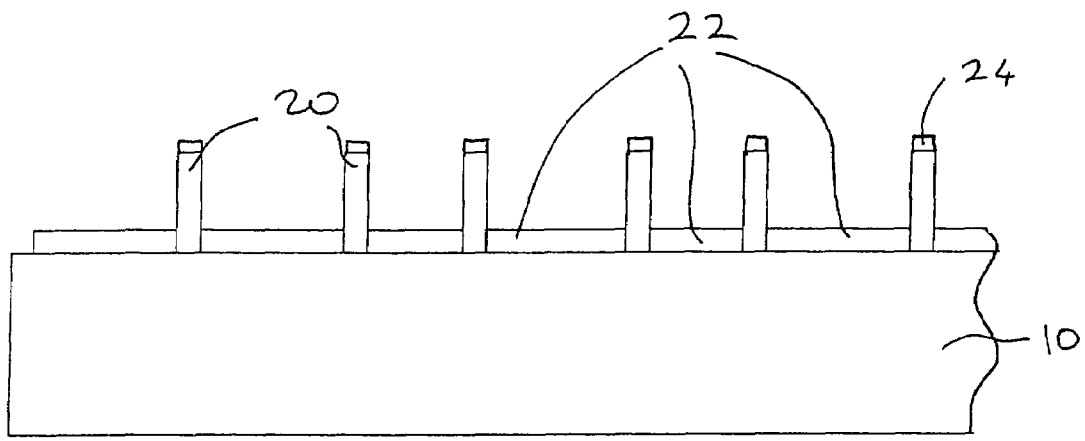
Figure 3b – After removal of the ridges of the film-forming substance
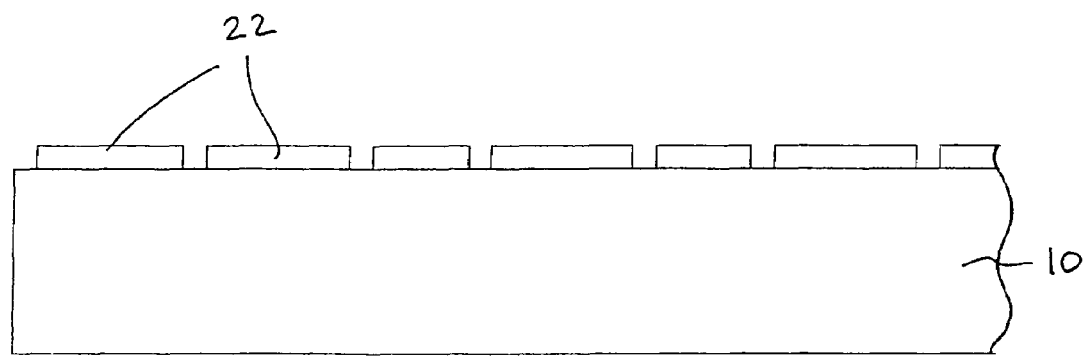

Figure 4 – Arrangement of latent source and drain electrodes
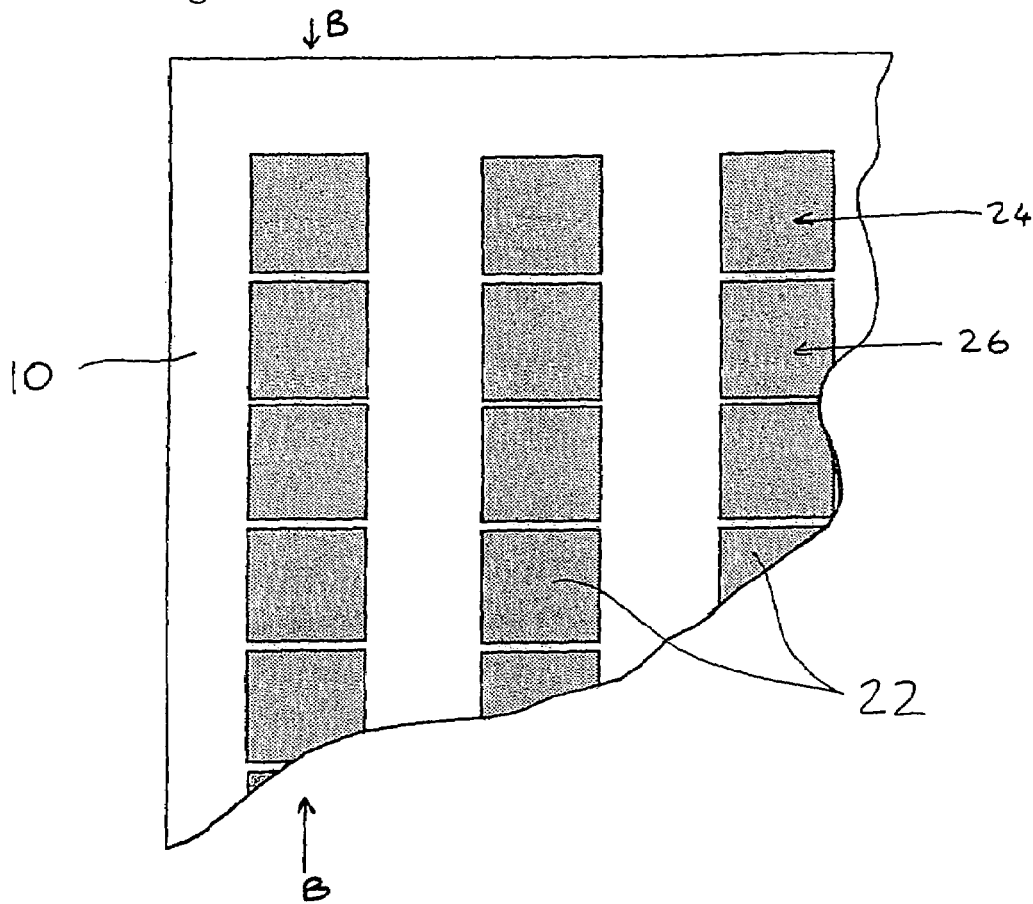
Figure 5 – Thin film transistor
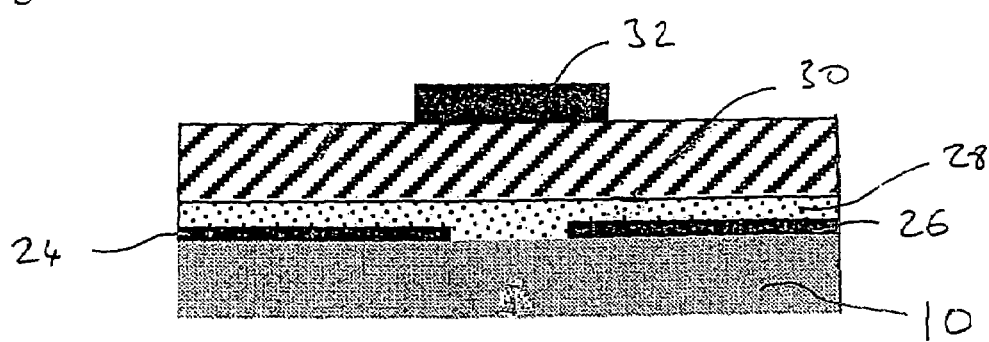

PATTERNING METHOD FOR FABRICATING HIGH RESOLUTION STRUCTURES

The present invention relates to a patterning method capable of fabricating high resolution structures, particularly to such a method which is useful for the manufacture of an extended 2-dimensional array of thin film polymer transistors.

There is a desire to provide a low-cost, high-resolution patterning method which is capable of being used in the fabrication of an extended array of thin film transistors on a substrate. Such patterning has conventionally been carried out by using the technique of photolithography. Whilst this technique allows for very high resolution patterning, it usually requires a step in which a photomask has to be accurately aligned to previously fabricated fine structures. Typically, such alignment has to be within a tolerance of about 0.1 µm otherwise the resulting electronic devices will not function because their various components will not be correctly aligned with one another. This need to achieve such a precise alignment is technically demanding as a consequence of which alignment steps represent a significant cost in the context of the manufacturing process as a whole. However, there is a constant pressure to reduce the cost of fabricating advanced electronic products of this type.

In the fabrication of an array of thin film transistors, one of the most demanding steps is to ensure that the source and drain electrodes of each individual transistor have a narrow but consistent separation. Ideally, this separation should be preferably less than 10 µm, and ideally about 0.1-1.0 µm, in order to ensure that the thin film transistor has desirable characteristics. To achieve such a consistent separation has in the past required a relatively high resolution fabrication technique. The present invention seeks to provide an alternative technique for fabricating the source and drain electrodes using a so-called "edge effect" applied to a pre-patterned low resolution structure.

It is acknowledged that the use of edge effects to fabricate high resolution structures is known. These previously known fabrication methods include such techniques as near-field optical lithography, growth of a self-assembled monolayer of molecules on the edge of a patterned thin film, side-wall deposition and wet-etching induced undercut. However, these techniques are all relatively complex and costly to put into commercial production.

Accordingly, the present invention aims to tackle the above-mentioned problems by providing a patterning method which enables high resolution structures to be fabricated by means of a spin-coating induced edge effect applied to a pre-patterned low resolution structure. In particular, the present invention aims to provide a patterning method which can be used to fabricate an extended 2-dimensional array of thin film transistors on a substrate in which high resolution structures can be formed without the need to use a conventional high resolution fabrication step.

According to a first aspect, the present invention provides a patterning method comprising the steps of:
  (i) pre-patterning a layer of material on a substrate,
  (ii) spin-coating a solution of a film-forming substance over the pre-patterned substrate,
  (iii) drying the spin-coated solution to form a film of the film-forming substance on the unpatterned areas of the substrate and on the surface and sides of the pre-patterned material,
  (iv) etching the dried film in such a way that it remains only around the sides of the pre-patterned material, and
  (v) removing the pre-patterned material to leave ridges of the film-forming substance on the substrate, the pattern of the ridges corresponding to the outline of the pre-patterned material.

The above patterning method provided by the first aspect of the present invention enables the fabrication of high resolution structures (the ridges of the film-forming substance) based only upon relatively low resolution pre-patterned structures. This method in turn enables the fabrication of complex electronic structures and devices at reduced cost.

Each ridge of the film-forming substance formed by the patterning method has a substantially uniform width, and the ridges extend either vertically up from the surface of the substrate or are inclined thereto. Typically the width of each ridge of the film-forming substance is 0.1-25 µm, preferably 0.10-10 µm, more preferably 0.20-5 µm. It is the width of the ridges and their pattern on the substrate which corresponds to the later fabricated high resolution structures which the patterning method of the present invention is intended to ultimately provide.

The pre-patterning in step (i) of the above patterning method is preferably carried by either photolithography or mask etching. According to both of these techniques, a layer of an appropriate resist material is coated on a substrate by for instance ink-jet printing or spin coating. This material is then subjected to patterning in the known way. It should be noted that this patterning step need not be aligned with any previously fabricated structure so that this step can be carried out in a low resolution fashion. It is the outline of the resulting "pre-pattern" which corresponds to the pattern of the ridges of the film-forming substance which are formed by the patterning method provided by the present invention.

After the pre-patterning step, a solution of a film-forming substance is then spin-coated over the pre-patterned substrate. In order to carry out this step, the film-forming substance is first dissolved (or dispersed) in a suitable solvent (or dispersant) preferably at a concentration of 0.1-10 g/l. The resulting solution is deposited on the (static) pre-patterned substrate which is then rapidly spun, preferably at a rate of 500-5,000 r.p.m. This forms a film of the film-forming substance on the unpatterned areas of the substrate and on the surface and sides of the pre-patterned material. It is important to note, as will be described later, that the film of the film-forming substance closely follows the profile of the pre-patterned substrate. This is a direct consequence of the technique of spin-coating. The film is then dried by for instance baking it at preferably 50-100° C. for 2-10 minutes.

The dried film is then etched in such a way that it remains only around the sides of the pre-patterned material. This is achieved by etching the film with plasma from directly above the substrate. This removes the dried film-forming substance from the top surfaces of the pre-patterned material as well as substantially from the unpatterned surfaces of the substrate between the areas of the pre-patterned material. The etching is however controlled such that the film-forming substance remains around the edges of the pre-patterned material where the film is at its thickest when measured vertically from the substrate surface.

The pre-patterned material is then removed leaving behind ridges of the film-forming substance on the substrate, the pattern of the ridges corresponding to the outline of the pre-patterned material. This removal can be carried out by for instance exposing the pre-patterned material to a suitable solvent to which the dried film-forming substance is insensitive. Thus this removal step does not disturb the ridges of the film-forming substance which remain attached at their bases to the substrate.

The above patterning method can be used in a second aspect of the present invention to form latent source and drain electrodes of a thin film transistor. Having formed ridges of the film-forming substance in a desired pattern on a substrate as previously described, a metal layer is then deposited on the patterned substrate. The ridges of the film-forming substance are then removed leaving discrete areas of metal which form the latent source and drain electrodes of a thin film transistor.

In the above context and elsewhere in this specification, the term "latent source and drain electrodes" means closely adjacent discrete areas of metal which can be used as the source and drain electrodes of a thin film transistor.

Preferably the pattern of the ridges of the film-forming substance is such that an extended 2-dimensional array of latent source and drain electrodes is formed by the above patterning method. Such an array is useful as an intermediate for fabricating display devices of relatively large area.

According to a third aspect of the present invention, a method is provided for forming an array of thin film transistors comprising:

(i) firstly forming a 2-dimensional array of latent source and drain electrodes on a substrate as described in connection with the second aspect of the present invention above, and (ii) selectively depositing on the 2-dimensional array areas of semiconductor, insulator and conductor, the latter forming a gate electrode associated with each pair of source and drain electrodes, to form the array of thin film transistors.

The semiconductor mentioned above may be an organic or inorganic semiconductor material. The use of an organic semiconductor material is advantageous because organic materials are generally solution-processable. There are however methods available to also make inorganic semiconductor materials solution-processable, for instance by forming colloidal suspensions of silicon or converting organic semiconductor materials into inorganic semiconductor materials.

It is particularly preferred that the above method should be used to manufacture a plurality of thin film transistors in the form of a 2-dimensional array whose area is at least $0.001$ m$^2$, preferably at least $0.01$ m$^2$ and most preferably at least $0.1$ m$^2$ such as about 1 m$^2$. The transistors may be packed in such an array at a density of at least 1,000 transistors/cm$^2$. In this case, a large area display device can be manufactured by coupling each transistor in the array to a light-emitting cell such as an organic light-emitting diode.

The present invention will now be described in further detail by reference to specific embodiments, an Example and the accompanying drawings in which:

FIGS. 1a-1f schematically illustrate the steps in cross-section of the patterning method in accordance with the first aspect of the present invention;

FIGS. 2a and 2b schematically illustrate in cross-section an alternative profile of the ridges of the film-forming substance which can be obtained in accordance with the first aspect of the present invention;

FIGS. 3a and 3b schematically illustrate the steps in cross-section for forming pairs of latent source and drain electrodes of a thin film transistor;

FIG. 4 is a plan view of FIG. 3b; and

FIG. 5 schematically illustrates in cross-section a top-gate thin film transistor fabricated in accordance with the third aspect of the present invention.

Turning firstly to FIGS. 1a-1f, these schematically illustrate the steps in cross-section of the first aspect of the present invention of a patterning method which forms a high resolution pattern of ridges of a film-forming substance on a substrate. Starting with FIG. 1a, this schematically illustrates in cross-section a substrate 10 such as a silicon wafer, glass or plastics. Examples of the latter include polyethylenenaphthalate (PEN) and polyethyleneterephthalate (PET). Typically the substrate has a thickness in the range 1 µm-10 mm, more preferably 10 µm-1 mm. The substrate is coated with a thin layer of patternable material 12 such as a resist. The patternable material can be coated on the substrate by ink-jet printing, spin-coating, dip-coating, doctor blading or spray coating. The layer of patternable material may be 0.25-10 µm thick, preferably 1-5 µm thick. Specific examples of the material 12 are etchable plastics such as polymethylmethacrylate and photoresists such as AZ-5214E which comprises a novolak resin and a naphthoquinone diazide as a photoactive compound. AZ-5214E may be dissolved in a solvent such as methoxy-propyl acetate which can be spin-coated onto the substrate 10 at a typical rotation speed of 3,000 r.p.m. If necessary, the patternable material is then dried by for instance baking in an oven.

The patternable material 12 is then patterned such as by mask etching which is schematically illustrated in FIGS. 1b and 1c. This can be done by covering the surface of the patternable material 12 with a suitably patterned mask formed for instance from copper. A particularly suitable pattern for the mask would be a striped pattern with 1 mm wide parallel openings which are in turn separated by 1 mm. A suitable material, e.g. a metal or semi-metal such as germanium, is then deposited through the mask to form stripes of masking material 14 on top of the patternable material 12. The thickness of the stripes of masking material can be relatively small, for instance just 10 nm. These stripes of masking material are resistant to certain types of etching.

The masked patternable material illustrated in FIG. 1b is then subjected to etching which removes areas of the patternable material 12 which are not covered by the masking material 14. Appropriate etching conditions are for instance flowing oxygen plasma at a rate of 200 ml/minute and at a power of 200 Watts. The stripes of masking material are resistant to such etching conditions and so are not disturbed by them, nor is the underlying patternable material 12. The resulting pre-patterned structure is illustrated schematically in cross-section in FIG. 1c. Thus the resulting structure comprises the substrate 10 supporting stripes of patterned material 12 each stripe being covered with a thin layer of masking material such as germanium.

As an alternative to mask etching, the patternable material 12 may be pre-patterned by optical lithography, holography, micro-embossing or photolithography in the known way. For instance, after spin-coating of a suitable photoresist such as AZ-5214E, this is dried for instance by baking. Suitable conditions are for instance 110° C. for 4 minutes. This baking step makes the resist photosensitive. The photoresist is then exposed through an appropriate striped mask to UV light. Appropriate conditions for this exposure are that the UV light has an intensity of 18 mW/cm$^2$ and a wavelength of 365 nm, and the exposure is carried out for about 10 seconds. The UV light causes the photoresist polymer to be cleaved into short chains in the exposed areas. As a next step, the exposed areas of the photoresist are removed using AZ developer which is an aqueous alkaline solution comprising potassium hydroxide, sodium hydroxide and an alkylarylsulfonate sodium salt. After the exposed areas have been removed, the resulting pre-patterned structure is then dried for instance by baking at 115° C. for 15 minutes. The resulting structure of this pre-patterning is similar to that illustrated in FIG. 1c but without the thin masking layers 14 on the top surface of the patterned material 12.

The pre-patterned layer of material on the substrate may, in the alternative, be produced by ink-jet printing, pad-printing, screen printing or offset printing.

The next step of the patterning method is to spin-coat a solution or suspension of the film-forming substance over the pre-patterned substrate illustrated in FIG. 1c. Spin-coating is a well known technique in the technical art of semiconductor manufacture. It comprises depositing an appropriate quantity of solution to cover the substrate and then rapidly rotating the latter. Most of the solution is flung from the substrate. On the other hand, a thin, relatively uniform layer of the solution remains which is typically 10 nm-20 μm thick depending upon the concentration of the solution. In this step of the present invention, any kind of film-forming substance can be chosen provided it can form a uniform spin-coated film and can be etched by plasma. Appropriate materials include polymers such as polystyrene or polythiophene. These polymers can be dissolved in many common organic solvents such as toluene to form a solution having concentration typically in the range 0.1-10 g/l, more preferably 0.5-5 g/l. This is further advantageous because toluene typically does not dissolve the pre-patterned material 12 such as AZ-5214E or polymethylmethacrylate. Alternatively, the solution which is spin-coated may be in the form of a colloidal suspension of a film-forming organic or inorganic material in a suitable dispersant.

The cross-sectional structure of the resulting spin-coated substrate is schematically illustrated in FIG. 1d. It will be noted that the film 16 of the film-forming substance (the thickness of which is exaggerated in this Figure) closely follows the contours of the pre-patterned material illustrated in FIG. 1c. The thickness of the spin-coated layer is typically 10 nm-2 μm. The thickness of the film 16 can be controlled by varying the concentration of the film-forming substance in the solution (or dispersion) and the spin speed. Typical spin speeds used to spin-coat the film-forming substance are 500-5,000 r.p.m. After spin-coating, the film 16 is dried to remove the solvent, typically by baking for instance for 5 minutes at 60° C. although the precise conditions will of course depend upon the film-forming substance and the solvent used.

The next step in the patterning method is to etch away the uniform film formed from the film-forming substance in such a way that it remains only around the sides of the pre-patterned material 12. In other words, the film is removed substantially from the top surface of the substrate 10 and from the top surface of the pre-patterned material 12. This can be done by subjecting the structure illustrated in FIG. 1d to plasma etching from above using for instance oxygen at a gas flow rate of 200 ml/minute at power of 100 Watts. The appropriate etching time depends upon the thickness of the film 16 but typically takes 1-10 minutes. The resulting etched structure is illustrated in FIG. 1e. It will be noted that the film 16 remains only around the sides of the patterned material 12 because the etching process removes the thin film from the tops of the pre-patterned material 12 and from the surface of the substrate. However, as the etching plasma is directed vertically downwards, it does not etch through the relatively thick layer of the film-forming substance which surrounds the areas of the pre-patterned material 12 in the time it takes to etch away the uniform film from the surface of the substrate and from the top surface of the pre-patterned material.

As an alternative to plasma etching, the film may also be removed by other etching techniques such as laser ablation. It will be understood that what is important in the etching step is that the film of the film-forming substance is removed where it forms a film of uniform thickness on the substrate and on the pre-patterned material but remains where it abuts against the sides of the pre-patterned material as illustrated in FIG. 1e.

Finally, the pre-patterned material 12 is removed by for instance dissolving or loosening with a suitable organic solvent such as a ketone, e.g. acetone, or an ether. It is found in practice that if a thin layer (e.g. 10 nm thick) of material 14 remains on the top surface of the pre-patterned material, the solvent may be able to pass through defects in it and dissolve away the underlying patterned material 12. If however the layer of masking material 14 is thicker, then it may have to be etched away to permit the solvent access to the pre-patterned material. Such etching can be performed using $CF_4$ plasma at a gas flow rate of 150 ml/minute and at a power of 150 Watts. In these conditions, typical etching speeds are around 25 nm/minutes. It should be noted that because $CF_4$ plasma does not etch the film-forming substance 16, such a treatment does not affect the dried film around the edges of the patterned material.

The resulting patterned material is illustrated in FIG. 1f. Thus it comprises the substrate 10 from which ridges 20 formed from the film-forming substance extend upwardly, the pattern of the ridges corresponding to the outline of the pre-patterned etched material which is illustrated in FIG. 1c. In the embodiment illustrated in FIG. 1f, each ridge has generally uniform width. The ridges extend generally vertically up from the surface of the substrate.

An alternative arrangement of the ridges is schematically illustrated in FIG. 2. FIG. 2a corresponds to the etched masked patternable material illustrated in FIG. 1c but in which the etching step has resulted in the pre-patterned material 12 having slightly sloping sides. Such a profile is in fact often obtained following developing or etching of a resist. This is mainly due to the absorption of the photoactive compound which attenuates the light as it penetrates through the resist material. This is sometimes called the bulk effect. The result is a higher dissolution rate at the top of the resist layer relative to the bottom of the layer adjacent to the substrate. It will be appreciated that this in turn ultimately results in the production of ridges which are not precisely vertical but are inclined relative to the surface of the substrate. Such ridges are illustrated as 21 in FIG. 2b. It will be seen by comparing FIGS. 2a and 2b that the inclined ridges 21 maintain the outline of the pre-patterned material 12. As illustrated in FIG. 2b, each inclined ridge still generally has a uniform width.

The patterning method which has been described above is advantageous because it enables the fabrication of high-resolution structures, that is the ridges of the film-forming substance on the substrate, based only on pre-patterned structures which can have relatively low resolution. Thus the width of the ridges can be controlled to be in the range 0.1-10 μm by for instance varying the concentration of film-forming substance in the solution which is spin-coated on the pre-patterned substrate and/or by varying the rotation speed used in the spin-coating step.

The ridges which are formed according to this patterning method can in turn be used to generate new structures with equally high resolution. This provides a simple, fast and relatively inexpensive technique to produce high resolution components of electronic devices such as thin film transistors. This is illustrated in FIGS. 3a and 3b. Thus FIG. 3a illustrates the step of depositing a conductive layer over the ridged substrate illustrated in FIG. 1f. This can be done for instance by using the same stripped mask as was used to produce the pattern of masking material illustrated in FIG. 1b. The line pattern on the mask is orientated orthogonally to the parallel striped ridge structures 20 on the substrate 10. Firstly a thin layer of chromium is evaporated through the mask to form chromium strips having a thickness of about 5 nm followed directly by evaporating gold to form conductive strips having a thickness of about 15 nm. The function of the chromium is to improve the adhesion between the gold and the substrate 10. This evaporation of metal deposits areas of metal 22 between the ridges as well as incidental metal deposits 24 on the top of the ridges themselves.

In a subsequent step, the film-forming substance forming the ridges is removed by treating the metal-deposited ridged substrate with an appropriate solvent such as toluene. This treatment can be carried out in an ultrasonic bath at an elevated temperature of about 60° C. This removes the ridges from the substrate leaving discrete conductive areas 22 formed from the deposited metal (gold overlying chromium). Incidentally, if the ridges are inclined as illustrated in FIG. 2b, it may be easier to remove them in this step because the solvent will have direct access to the junction between the ridges and the substrate. This is because metal will not be deposited under the overhang of the inclined ridge leading to there being a gap between the evaporated metal and the side of the ridge where the latter is in contact with the substrate. In this case, the solvent is able to directly loosen the point of attachment between the inclined ridge and the substrate.

A plan view of the resulting pattern of conductive areas is schematically illustrated in FIG. 4. Thus FIG. 4 illustrates an extended 2-dimensional array of latent source and drain electrodes. It will be appreciated that FIG. 3b is generally the cross-section through the line B-B of FIG. 4. In more detail, an adjacent pair of metallic areas such as 24 and 26 are separated by the thickness of the (now removed) ridge of film-forming substance. This separation is preferably between 0.1-10 μm, more preferably 0.1-5 μm. The adjacent pair of areas constitute latent source and drain electrodes of a thin film transistor insofar as they have an appropriate size and spatial relationship for this purpose. In principle, the 2-dimensional array which is illustrated in FIG. 4 can be formed to have any desirable area. This array of latent source and drain electrodes may be formed into an array of thin film transistors by selectively depositing on the array areas of semiconductor, insulator and conductor, the latter forming a gate electrode associated with each pair of source and drain electrodes, to form the array of thin film transistors.

In a variant of the patterning method according to the first aspect of the present invention, the substrate upon which the ridge pattern is formed is a multi-layer structure comprising in order a substrate as described above formed from a silicon wafer, glass or plastics, coated with a layer of resist coated in turn with a thin layer of masking material such as a metal or semi-metal, e.g. germanium. In this case, the patterning method is performed on this multi-layer structure as the "substrate" so that the ridge pattern is formed on the masking material. The resulting ridged structure is then subjected to plasma etching to remove firstly the masking material and then secondly to remove the resist where not covered by the ridged pattern. The first etching step may be carried out using $CF_4$ plasma and the second etching step using oxygen plasma.

The resulting structure comprises the substrate bearing a pattern of relatively tall ridges, each ridge consisting of the ridge as formed in accordance with the first aspect of the present invention supported on the thin layer of masking material supported in turn by the underlying un-etched resist. Forming a taller ridge pattern makes it possible to deposit a much thicker conductive layer up to several microns deep from which pairs of latent source and drain electrodes can be formed along generally the same lines as illustrated in FIGS. 3a and 3b and as described above.

A typical thin film transistor which can be fabricated from the pair of source and drain electrodes 24,26 illustrated in FIG. 4 is illustrated in FIG. 5. Such a transistor comprises the substrate 10 and source and drain electrodes 24,26. A layer of semiconductor 28 bridges between the source and drain electrodes. The semiconductor may be an inorganic semiconductor but more preferably is an organic semiconductor as these are more easily solution processable. Examples of suitable organic semiconductors include 3-hexylthiophene (P3HT) or polyarylamine (PAA). The layer of semiconductor is typically 10-300 nm thick, preferably 20-150 nm. The semiconductor is covered with a layer of dielectric 30 which can be formed from such materials as polyamide, polymethylmethacrylate, poly(4-methyl-1-pentene) or poly(4-vinylphenyl). The insulating layer typically has a thickness of 30 nm-2 μm, more preferably 50 nm-0.75 μm. The semiconductor and dielectric can be deposited by for instance ink-jet printing or pad-printing. Finally, a gate electrode 32 is deposited on the dielectric layer 30 in appropriate spatial relationship with the source and drain electrodes. The gate electrode is typically formed by thermal evaporation of a metal or by ink-jet printing of a polymer solution or suspension containing colloidal particles in a suitable dispersant. The thickness of the gate electrode is preferably 10-1000 nm. The gate electrode may be formed from such metals as chromium, aluminium, gold, silver, copper, nickel, or any combination thereof. It will be understood that in the context of the thin film transistor illustrated in FIG. 5, the separation between the source and drain electrodes 24, 26 corresponds to the thickness of the ridge of film-forming substance which is formed in accordance with the patterning method according to the first aspect of the present invention.

It will be appreciated that the 2-dimensional array illustrated in FIG. 4 can give rise to an extended 2-dimensional array of thin film transistors. Such an array preferably has an area of at least 0.001 $m^2$, more preferably about 1 $m^2$. The transistors may be packed in such an array at a density of at least 1,000 transistors/$cm^2$. In this case, a large area display device can be manufactured by coupling each transistor in the array to a light-emitting cell such as an organic light-emitting diode.

The ridge pattern produced in accordance with the first aspect of the present invention may also be used in other fields of technology. For instance, it may also be used to fabricate sub-micron channels for use in DNA separation.

The invention will now be further explained by reference to the following Example.

EXAMPLE

The patterning method of the present invention was used to fabricate an array of top-gate thin film transistors on a substrate.

Firstly, a 1.4 μm thick layer of AZ-5214E photoresist was spin-coated on a 1.5 mm thick glass substrate at a rotation speed of 3000 r.p.m. The photoresist was provided as a solution in methoxy-propyl acetate. The photoresist was then baked at 110° C. for 4 minutes in order to remove the solvent.

The photoresist was then patterned by exposure to UV light for 10 seconds at a power of 18 mW/$cm^2$. The exposure was carried out through a mask having a slotted striped pattern in which the slots are 1 mm wide and separated from each other by 1 mm. Exposed areas of the photoresist were then removed by treating the imaged structure with developer for 1 minute. The developer used consisted of 50% by volume AZ developer and 50% by volume water. As is well-known, AZ developer comprises potassium hydroxide, sodium hydroxide and an alkylarylsulfonate sodium salt.

The etched pre-patterned structure was then baked at 115° C. for 15 minutes. A solution comprising 1 g/l of polystyrene in toluene was then spin-coated on the pre-patterned substrate. The rotation speed used was 3000 r.p.m. The resulting film was baked at 60° C. for 5 minutes which forms a film of polystyrene having a thickness of 100 nm over the entire surface of the pre-patterned substrate.

The spin-coated, pre-patterned substrate was then subjected to oxygen plasma etching at a gas flow rate of 200 ml/minute and power of 100 Watts for 2 minutes. This removed the polystyrene layer from the top surfaces of the pre-patterned material and from the substrate between the pre-patterned material but not from around the sides of the pre-patterned material. The remaining pre-patterned material was then removed by dissolving in acetone leaving 0.5 μm wide ridges of polystyrene extending up from the substrate.

Conductive stripes were then evaporated onto the ridged substrate using the same striped mask as described above but in which the stripes are orientated orthogonally to the previously formed ridges. The stripes consist of a 5 nm film of chromium supporting a 15 nm film of gold. The layer of chromium is provided in order to promote adhesion of the gold to the substrate. After evaporation of the metal areas, the polystyrene ridges were then removed using toluene at 60° C. in an ultrasonic bath. This results in an extended array of metalized areas being formed as illustrated in FIG. 4. Adjacent metalized areas are separated by the width of the polystyrene ridge, that is 0.5 μm. A semiconductor layer having a thickness of 100 nm of polyarylamine was then spin-coated and then baked at 80° C. for 30 minutes. Next, a 700 nm thick dielectric layer formed from polymethylmethacrylate was then spin-coated followed again by baking at 80° C. for 30 minutes. Finally, a gate electrode formed from poly(3,4-ethylenedioxythiopene)-polystyrenesulphonic acid was then ink-jet printed on the dielectric layer in registration above the gap between the source and drain electrodes to form a thin film transistor of the type illustrated in FIG. 5.

The invention claimed is:

1. A patterning method of forming a thin film transistor, the method comprising:
   forming a plurality of patterns by applying a first liquid material including a photoresist material and a first solvent over a substrate, each of the plurality of patterns including the photoresist material;
   forming a film covering the plurality of patterns by applying a second liquid material including a polystyrene and a second solvent to the plurality of patterns with a spin coating method, a concentration of the polystyrene in the second liquid material being 0.1-10 g/l;
   removing the film from the top surface of each of the plurality of patterns and substantially from the top surface of the substrate by subjecting the substrate to plasma etching from above so that the film remains only around the sides of the plurality of patterns in the form of a plurality of ridges attached to the sides of the plurality of patterns;
   removing each of the plurality of patterns by dissolving each of the plurality of patterns with a third solvent that is insensitive to the polystyrene;
   forming a first and a second metal film, one of the plurality of ridges being disposed between the first and second metal films;
   removing the plurality of ridges to form a space between the first and second metal films, a distance between the first and second metal films being 0.1-10μm;
   forming a semiconductor layer over the first and second metal films;
   forming a dielectric layer over the semiconductor layer; and
   forming a gate electrode over the dielectric layer.

2. The patterning method of forming a thin film transistor according to claim 1, the spin coating method being performed at 500-5000 rpm.

3. The patterning method of forming a thin film transistor according to claim 1, a distance between the first and second metal films being the same as a width of one of the plurality of ridges.

4. The patterning method of forming a thin film transistor according to claim 1, the first and second metal films being a source electrode and a drain electrode, respectively.

5. A patterning method of forming a thin film transistor, the method comprising:
   forming a plurality of patterns by applying a first liquid material including a photoresist material and a first solvent over a substrate, each of the plurality of patterns including the photoresist material;
   forming a film covering the plurality of patterns by applying a second liquid material including a polystyrene and a second solvent to the plurality of patterns with a spin coating method;
   removing the film from the top surface of each of the plurality of patterns and substantially from the top surface of the substrate by subjecting the substrate to plasma etching from above so that the film remains only around the sides of the plurality of patterns in the form of a plurality of ridges attached to the sides of the plurality of patterns;
   removing each of the plurality of patterns by dissolving each of the plurality of patterns with a third solvent that is insensitive to the polystyrene;
   forming a first and a second metal film, one of the plurality of ridges being disposed between the first and second metal films;
   removing the plurality of ridges to form a space between the first and second metal films;
   forming a semiconductor layer over the first and second metal films;
   forming a dielectric layer over the semiconductor layer; and
   forming a gate electrode over the dielectric layer.

6. A patterning method of forming a thin film transistor, the method comprising:
   forming a plurality of patterns by applying a first liquid material including a first material and a first solvent over a substrate, each of the plurality of patterns including the first material;
   forming a film covering the plurality of patterns by applying a second liquid material including a second material and a second solvent to the plurality of patterns with a spin coating method;
   removing the film from the top surface of each of the plurality of patterns and substantially from the top surface of the substrate by subjecting the substrate to plasma etching from above so that the film remains only around the sides of the plurality of patterns in the form of a plurality of ridges attached to the sides of the plurality of patterns;
   removing each of the plurality of patterns by dissolving each of the plurality of patterns with a third solvent that is insensitive to the second material;
   forming a first and a second metal film, one of the plurality of ridges being disposed between the first and second metal films;
   removing the plurality of ridges to form a space between the first and second metal films;
   forming a semiconductor layer over the first and second metal films;

forming a dielectric layer over the semiconductor layer; and forming a gate electrode over the dielectric layer.

7. The patterning method of forming a thin film transistor according to claim 5, a concentration of the second material in the second liquid material being 0.1-10 g/l.

8. The patterning method of forming a thin film transistor according to claim 5, the spin coating method being performed at 500-5000 rpm.

9. The patterning method of forming a thin film transistor according to claim 5, a distance between the first and second metal films being 0.1-10 µm.

10. The patterning method of forming a thin film transistor according to claim 5, a distance between the first and second metal films being the same as a width of one of the plurality of ridges.

11. The patterning method of forming a thin film transistor according to claim 5, the first and second metal films being a source electrode and a drain electrode, respectively.

12. The patterning method of forming a thin film transistor according to claim 5, the semiconductor layer including an organic semiconductor material.

* * * * *